(12) United States Patent  (10) Patent No.: US 9,130,513 B2
Lim et al.  (45) Date of Patent: Sep. 8, 2015

(54) METHOD AND APPARATUS FOR AMPLIFYING AUDIO SIGNAL

(75) Inventors: Dong-hyun Lim, Suwon-si (KR);
Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 716 days.

(21) Appl. No.: 12/977,659

(22) Filed: Dec. 23, 2010

(65) Prior Publication Data

US 2011/0170717 A1  Jul. 14, 2011

(30) Foreign Application Priority Data

Jan. 8, 2010 (KR) .................. 10-2010-0001899

(51) Int. Cl.
*H03F 21/00* (2006.01)
*H03F 3/217* (2006.01)

(52) U.S. Cl.
CPC .......... *H03F 3/2173* (2013.01); *H03F 2200/03* (2013.01); *H03F 2200/351* (2013.01)

(58) Field of Classification Search
CPC .......... H03F 3/217; H03C 3/403; H03C 3/40; H03C 1/62
USPC ............. 381/120, 111, 116, 117, 1–4, 56, 58, 381/161; 375/300
See application file for complete search history.

(56) References Cited

U.S. PATENT DOCUMENTS

| 4,164,714 | A | * | 8/1979 | Swanson | 330/10 |
|---|---|---|---|---|---|
| 4,415,862 | A | * | 11/1983 | Kunugi | 330/10 |
| 4,468,626 | A | * | 8/1984 | Swanson | 330/10 |
| 4,540,957 | A | * | 9/1985 | Hanna | 332/149 |
| 4,580,111 | A | * | 4/1986 | Swanson | 332/152 |
| 4,638,504 | A | * | 1/1987 | Salek | 381/16 |
| 4,870,374 | A | * | 9/1989 | Harris | 332/145 |
| 5,561,686 | A | * | 10/1996 | Kobayashi et al. | 375/134 |
| 5,789,992 | A | * | 8/1998 | Moon | 332/109 |
| 6,347,221 | B1 | * | 2/2002 | Tsukahara et al. | 455/333 |
| 6,597,893 | B2 | * | 7/2003 | Zettler | 455/41.1 |
| 6,600,376 | B1 | * | 7/2003 | Yang | 330/297 |
| 7,016,659 | B1 | * | 3/2006 | Dorrough et al. | 455/108 |
| 7,109,789 | B2 | * | 9/2006 | Spencer | 330/10 |
| 7,936,811 | B2 | * | 5/2011 | Ohta et al. | 375/229 |
| 7,948,313 | B2 | * | 5/2011 | Tsuji et al. | 330/251 |
| 2003/0058956 | A1 | * | 3/2003 | Rosnell et al. | 375/295 |
| 2004/0004515 | A1 | * | 1/2004 | Takahashi et al. | 329/304 |
| 2004/0028242 | A1 | * | 2/2004 | Kitamura | 381/96 |
| 2004/0184559 | A1 | * | 9/2004 | Ballantyne | 375/300 |

(Continued)

FOREIGN PATENT DOCUMENTS

KR  10-2002-0093649 A  12/2002
KR  10-2006-0019683 A  3/2006

*Primary Examiner* — Lun-See Lao
(74) *Attorney, Agent, or Firm* — Sughrue Mion, PLLC

(57) ABSTRACT

An audio signal amplifying device and method for reducing a size and corresponding power consumption of demodulation filters in the signal amplifying device. In the device and method, carrier waves having phase shifts are generated from a received audio signal. The shifted carrier waves are compared to the audio signal to generate modulation signals, which are amplified based on a power supply voltage. The amplified modulation signals or a power supply signal are output based on a comparison between the carrier waves and the audio signal. The output signals are synthesized to produce a synthesized signal having a lower average voltage and current value, thus reducing power consumption of the signal amplifying device.

20 Claims, 5 Drawing Sheets

(56) References Cited

U.S. PATENT DOCUMENTS

| | | | |
|---|---|---|---|
| 2004/0235435 A1* | 11/2004 | Barabash | 455/104 |
| 2005/0029994 A1* | 2/2005 | Hisamoto et al. | 323/280 |
| 2005/0089178 A1* | 4/2005 | Asada et al. | 381/106 |
| 2005/0116771 A1* | 6/2005 | Sawashi | 330/10 |
| 2005/0152561 A1* | 7/2005 | Spencer | 381/77 |
| 2006/0068726 A1* | 3/2006 | Yamawaki | 455/126 |
| 2007/0015473 A1* | 1/2007 | Spencer | 455/102 |
| 2007/0286301 A1* | 12/2007 | Ohta et al. | 375/265 |
| 2008/0101628 A1* | 5/2008 | Takagishi | 381/120 |
| 2008/0161953 A1* | 7/2008 | Takagishi et al. | 700/94 |
| 2008/0285760 A1* | 11/2008 | Lee | 381/1 |
| 2010/0013554 A1* | 1/2010 | Park | 330/10 |
| 2010/0052792 A1* | 3/2010 | Nose et al. | 330/295 |
| 2010/0176893 A1* | 7/2010 | Nose et al. | 332/144 |
| 2011/0170719 A1* | 7/2011 | Kim et al. | 381/161 |
| 2012/0230520 A1* | 9/2012 | Lim | 381/123 |

\* cited by examiner

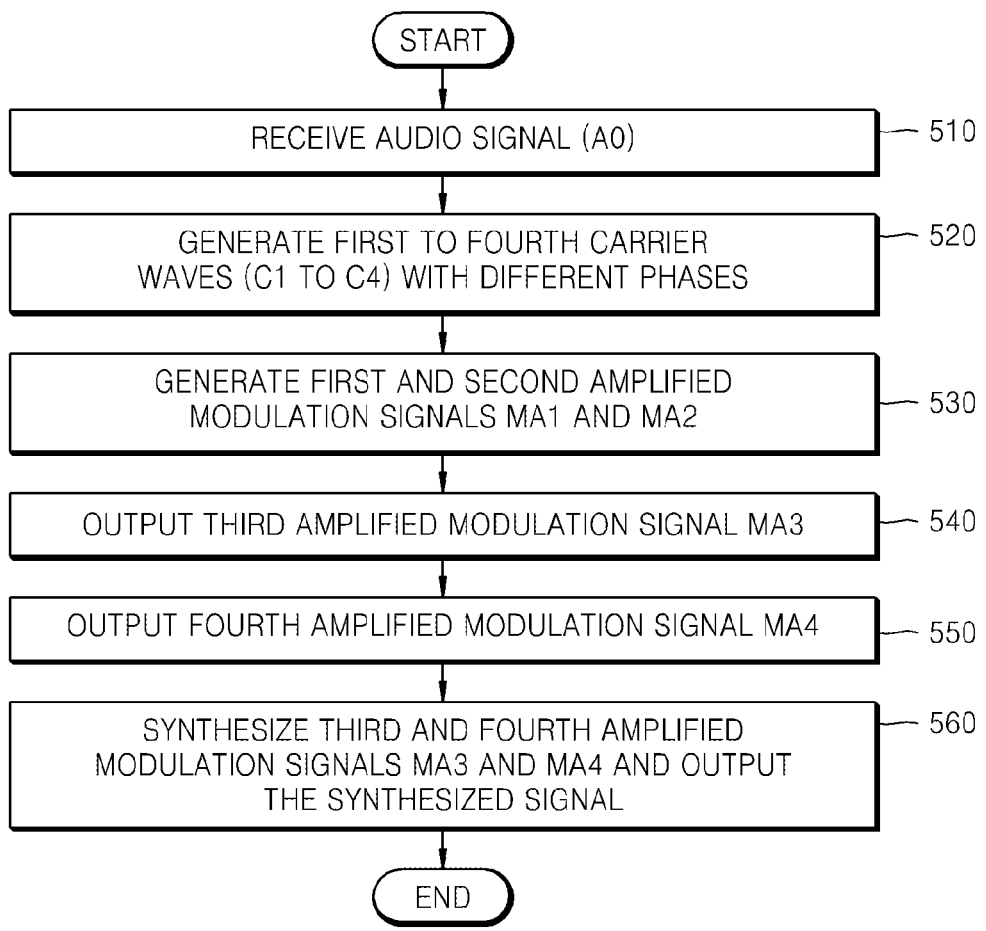

METHOD AND APPARATUS FOR AMPLIFYING AUDIO SIGNAL

CROSS-REFERENCE TO RELATED PATENT APPLICATION

This application claims priority from Korean Patent Application No. 10-2010-0001899, filed on Jan. 8, 2010, in the Korean Intellectual Property Office, the disclosure of which is incorporated herein by reference in its entirety.

BACKGROUND

1. Field

The present disclosure relates to a device for amplifying an audio signal and a method thereof.

2. Description of the Related Art

Conventional audio signal amplifying devices modulate an audio signal using a carrier wave. Conventionally, the modulated signal, which is generated by using the carrier wave, is amplified. Then, a demodulation operation is performed on the amplified modulated signal, using a demodulation filter, so that the carrier wave element included in the amplified modulated signal is eliminated. At this time, as the intensity of voltage and current of the amplified modulated signal is increased, the demodulation filter becomes larger. Accordingly, the size and power consumption of the audio signal amplifying device are increased.

SUMMARY

The present disclosure provides a device for amplifying an audio signal and a method thereof.

According to an exemplary embodiment, there is provided an audio signal amplifying device, including a receiving unit that receives an audio signal; a carrier wave generation unit that generates first, second, third, and fourth carrier waves, the first, second, third, and fourth carrier waves having phases that are different from one another; an amplified modulation signal generation unit that compares the first carrier wave and the second carrier wave to the audio signal, respectively, generates a first modulation signal and a second modulation signal, respectively, based on results of the comparisons, amplifies the first modulation signal and the second modulation signal, respectively, based on a value of a first power supply voltage, and generates a first amplified modulation signal and a second amplified modulation signal from the amplified first modulation signal and the amplified second modulation signal, respectively; a first output unit that outputs a first output, the first output comprising one of the first amplified modulation signal or a second power supply voltage, according to a logic state of a third modulation signal, the third modulation signal generated from a result of comparing the third carrier wave to the audio signal; a second output unit that outputs a second output, the second output comprising one of the second amplified modulation signal or the second power supply voltage, according to a logic state of a fourth modulation signal, the fourth modulation signal generated from a result of comparing the fourth carrier wave to the audio signal; and a final output unit that synthesizes the first output and the second output, and outputs the synthesized signal.

Each of the first and the second amplified modulation signals may have a first voltage period having a first logic state and a second voltage period having a second logic state, and a portion of the first voltage period of the first amplified modulation signal is overlapped by a portion of the first voltage period of the second amplified modulation signal.

The carrier wave generation unit may generate the first carrier wave, and may generate the first carrier wave, and generates the second, the third, and the fourth carrier waves by shifting a phase of the first carrier wave.

A phase difference between the first and the second carrier waves may be 180 degrees, and a phase difference between the third and the fourth carrier waves may be 180 degrees.

The first and second modulation signals may be Pulse Width Modulation (PWM) signals.

The first and the second power supply voltage may have absolute voltage values that are equal to each other.

The audio signal amplifying device may further include a demodulation filter that demodulates the first output and the second output, wherein the final output unit may synthesize the demodulated first output and the demodulated second output, and outputs the synthesized signal.

The final output unit may invert a sign of the second, and synthesize the inverted second output and the first output, and output the synthesized signal.

According to another exemplary embodiment, there is provided a method of amplifying an audio signal, including receiving an audio signal; generating first, second, third, and fourth carrier waves, the first, second, third, and fourth carrier waves having phases that are different from one another; comparing the first carrier wave and the second carrier wave to the audio signal, respectively; generating a first modulation signal and a second modulation signal, respectively, based on results of the comparing; amplifying the first modulation signal and the second modulation signal, respectively, based on a value of a first power supply voltage; generating a first amplified modulation signal and a second amplified modulation signal from the amplified first modulation signal and the amplified second modulation signal, respectively; outputting a first output, the first output comprising one of the first amplified modulation signal or a second power supply voltage, according to a logic state of a third modulation signal, the third modulation signal generated from a result of comparing the third carrier wave to the audio signal; outputting a second output, the second output comprising one of the second amplified modulation signal or the second power supply voltage, according to a logic state of a fourth modulation signal, the fourth modulation signal generated from a result of comparing the fourth carrier wave to the audio signal; synthesizing the first output value and the second output value to generate a synthesized signal; and outputting the synthesized signal.

According to another exemplary embodiment, there is provided a computer-readable recording medium storing a program for performing a method of amplifying an audio signal, including receiving an audio signal; generating first, second, third, and fourth carrier waves, the first, second, third, and fourth carrier waves having phases that are different from one another; comparing the first carrier wave and the second carrier wave to the audio signal, respectively; generating a first modulation signal and a second modulation signal, respectively, based on results of the comparing; amplifying the first modulation signal and the second modulation signal, respectively, based on a value of a first power supply voltage; generating a first amplified modulation signal and a second amplified modulation signal from the amplified first modulation signal and the amplified second modulation signal, respectively; outputting a first output, the first output comprising one of the first amplified modulation signal or a second power supply voltage, according to a logic state of a third modulation signal, the third modulation signal generated from a result of comparing the third carrier wave to the audio signal; outputting a second output, the second output comprising one of the second amplified modulation signal or the second power supply voltage, according to a logic state of a fourth modulation signal, the fourth modulation signal generated from a result of comparing the fourth carrier wave to the audio signal; synthesizing the first output value and the second output value to generate a synthesized signal; and outputting the synthesized signal.

BRIEF DESCRIPTION OF THE DRAWINGS

The above and other features and advantages will become more apparent by describing in detail exemplary embodiments thereof, with reference to the attached drawings in which:

FIG. 5 is a flowchart illustrating a method of amplifying the audio signal according an exemplary embodiment.

DETAILED DESCRIPTION

The present disclosure will now be described more fully with reference to the accompanying drawings, in which exemplary embodiments are shown.

Figure 1:
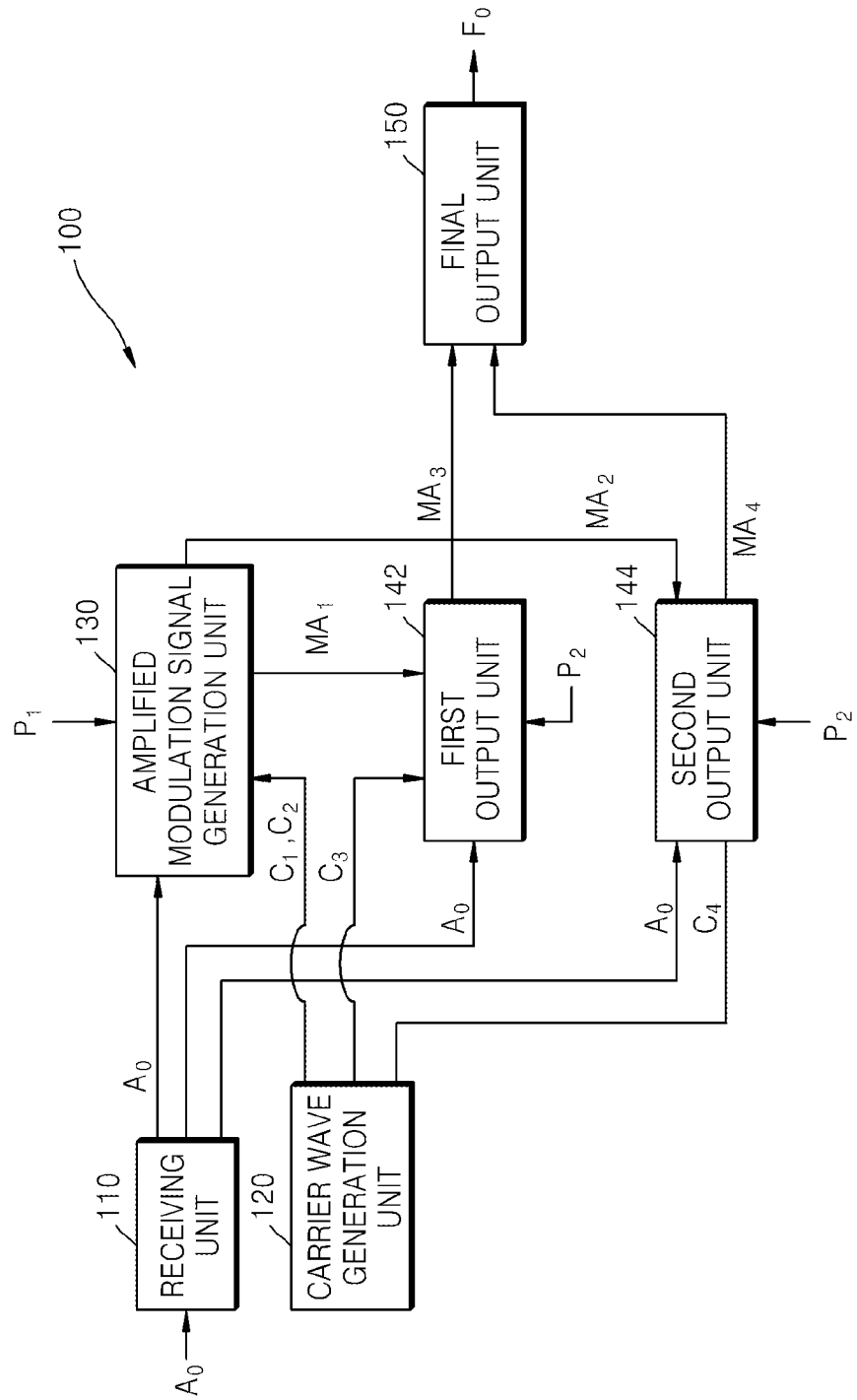
FIG. 1 is a diagram illustrating an audio signal amplifying device according to an exemplary embodiment.

FIG. 1 is a diagram illustrating an audio signal amplifying device according to an exemplary embodiment.

Referring to FIG. 1, an audio signal amplifying device 100 according to the exemplary embodiment includes a receiving unit 110, a carrier wave generation unit 120, an amplified modulation signal generation unit 130, a first output unit 142, a second output unit 144 and a final output unit 150.

The receiving unit 110 receives an audio signal A0.

The carrier wave generation unit 120 generates first to fourth carrier waves C1 to C4, whose phases are different from one another.

For instance, the carrier wave generation unit 120 may generate the first carrier wave C1, and then generate the second to the fourth carrier waves C2 to C4 by shifting a phase of the first carrier wave C1, for example, by 180 degrees, 90 degrees, and 270 degrees respectively.

The amplified modulation signal generation unit 130 generates a first amplified modulation signal MA1 and a second amplified modulation signal MA2 by amplifying a first modulation signal M1 and a second modulation signal M2, respectively, based on a voltage value of a first power supply voltage P1. Herein, the first and the second modulation signals M1 and M2 are respective results of comparing the first and the second carrier waves C1 and C2 with the audio signal A0.

For instance, when the amplified modulation signal generation unit 130 generates the first modulation signal M1, the amplified modulation signal generation unit 130 may generate the first modulation signal M1 in such a manner that the first modulation M1 has a low level while the voltage value of the first carrier wave C1 is equal to or lower than that of the audio signal A0 at a time domain, and has a high level while the voltage value of the first carrier wave C1 is higher than that of the audio signal A0. At this time, the low level state of the first modulation signal M1 means that the voltage value of the first modulation signal M1 is smaller than a predetermined critical value, and the high level state of the first modulation signal M1 means that the voltage value of the first modulation signal M1 is equal to or larger than the predetermined critical value.

If the first modulation signal M1 is generated as discussed above, the voltage value of the first modulation signal M1 is amplified to that of the first power supply voltage P1, and thus the first amplified modulation signal MA1 is generated. In the same manner, the second amplified modulation signal MA2 is generated. At this time, at the time domain, a time period where each of the first and the second amplified modulation signals MA1 and MA2 has the voltage value of the first power supply voltage P1 is termed a first voltage period. A time period where each of the first and the second amplified modulation signals MA1 and MA2 has 0V is termed a second voltage period. Then, the first and the second amplified modulation signals MA1 and MA2 are generated in such a manner that a portion of the first voltage period of the first amplified modulation signal MA1 is overlapped by a portion of the first voltage period of the second amplified modulation signal MA2.

For instance, when a portion of the first voltage period of the first amplified modulation signal MA1 is from 0 ms to 100 ms, a portion of the first voltage period of the second amplified modulation signal MA2 may be from 50 ms to 100 ms. If the first amplified modulation signal MA1 is synthesized with the second amplified modulation signal MA2 at the time period from 0 ms to 50 ms, the synthesized signal has the voltage value of the first power supply voltage P1. However, if the first amplified modulation signal MA1 is synthesized with the second amplified modulation signal MA2 at the time period from 50 ms to 100 ms, the synthesized signal has double of the voltage value of the first power supply voltage P1. In the exemplary embodiment, the first and the second amplified modulation signals MA1 and MA2 are not synthesized with each other, and the first and the second amplified modulation signals MA1 and MA2 are output to the first output unit 142 and the second output unit 144, respectively.

In the above method, the phases of the first and the second carrier waves C1 and C2, which are used for generating the first and the second modulation signals M1 and M2, may have been determined differently. Accordingly, the first and the second amplified modulation signals MA1 and MA2 may be generated in such a manner that the portion of the portion of the first voltage period of the first amplified modulation signal MA1 is overlapped by the portion of the first voltage period of the second amplified modulation signal MA2.

Meanwhile, in another exemplary embodiment, it may be checked whether the maximum voltage value of the audio signal A0 is equal to or lower than the critical value. In the case where the maximum voltage value of the audio signal A0 is equal to or lower than the critical value, the amplified modulation signal generation unit 130 may output two voltages approximated to 0V, instead of generating the first and the second amplified modulation signals MA1 and MA2. Further details are described later referring to FIG. 3.

The audio signal amplifying device according to the exemplary embodiment may further include a voltage control unit (not shown). The voltage control unit checks whether the maximum voltage value of the audio signal A0 is equal to or lower than the critical value. Then, in the case where the maximum voltage value of the audio signal A0 is equal to or lower than the critical value, the voltage control unit controls the amplified modulation signal generation unit 130 to output two voltages approximated to 0V, instead of the first and the second amplified modulation signals MA1 and MA2.

The first output unit 142 outputs the first amplified modulation signal MA1 or a second power supply voltage P2, as a third amplified modulation signal MA3, according to a logic state of a third modulation signal M3. Herein, the third modulation signal M3 is a result of comparing the third carrier wave C3 with the audio signal A0.

For instance, in the case where the logic state of the third modulation signal M3 is a low level state, the first amplified modulation signal MA1 may be output. In the case where the logic state of the third modulation signal M3 is a high level state, the second power supply voltage P2 may be output. On the other hand, in the case where the logic state of the third modulation signal M3 is a low level state, the first output unit 142 outputs the first amplified modulation signal MA1. Thus, the third amplified modulation signal MA3 has a voltage value of the first power supply voltage P1 or 0V. In the case where the logic state of the third modulation signal M3 is the high level state, the first output unit 142 outputs the second power supply voltage P2, and thus the third amplified modulation signal MA3 has a voltage value of the second power supply voltage P2.

In summary, the third amplified modulation signal MA3 has a voltage value of 0V, the first power supply voltage P1, or the second power supply voltage P2, according to the logic state of the third modulation signal M3. At this time, the second power supply voltage P2 may have the same absolute voltage value as the first power supply voltage P1 with a different sign.

Meanwhile, the exemplary embodiment is not limited to the above case. That is, the first amplified modulation signal MA1 may be output in the case where the logic state of the third modulation signal M3 is a high level state, and the second power supply voltage P2 may be outputted in the case where the logic state of the third modulation signal M3 is a low level state.

The second output unit 144 outputs the second amplified modulation signal MA2 or the second power supply voltage P2, as a fourth amplified modulation signal MA4, according to a logic state of a fourth modulation signal M4. Herein, the fourth modulation signal M4 is a result of comparing the fourth carrier wave C4 with the audio signal A0.

For instance, in the case where the logic state of the fourth modulation signal M4 is a low level state, the second amplified modulation signal MA2 may be output. In the case where the logic state of the fourth modulation signal M4 is a high level state, the second power supply voltage P2 may be output. That is, the fourth amplified modulation signal MA4 has a voltage value of 0V, the first power supply voltage P1, or the second power supply voltage P2, according to the logic state of the fourth modulation signal M4.

Meanwhile, the exemplary embodiment invention is not limited to the above case. That is, the second amplified modulation signal MA4 may be output in the case where the logic state of the fourth modulation signal M4 is a high level state, and the second power supply voltage P2 may be output in the case where the logic state of the fourth modulation signal M4 is a low level state. In the exemplary embodiment, the first to the fourth modulation signals M1 to M4 and the first to the fourth amplified modulation signals MA1 to MA4 may be Pulse Width Modulation (PWM) signals.

The final output unit 150 synthesizes the output value (MA1 or P2) of the first output unit 142 and the output value (MA2 or P2) of the second output unit 144, i.e., the third amplified modulation signal MA3 and the fourth amplified modulation signal MA4, and outputs a final output signal F0.

At this time, since each of the third and the fourth amplified modulation signals MA3 and MA4 has a voltage value of 0V, the first power supply voltage P1, or the second power supply voltage P2, the final output signal F0 output from the final output unit 150 may have a voltage value of 0V, the first power supply voltage P1, the second power supply voltage P2, double of the first power supply voltage P1, or double of the second power supply voltage P2. Also, a form of the final output signal F0 becomes similar to that of the audio signal A0 input to the audio signal amplifying device 100. That is, the final output signal F0 becomes an amplified version of the audio signal A0 received through the receiving unit 110.

In another exemplary embodiment, the final output unit 150 may receive the third and the fourth amplified modulation signals MA3 and MA4 through a positive (+) input unit and a negative (−) input unit of the final output unit 150, respectively. Accordingly, the final output unit 150 multiplies the fourth amplified modulation signal MA4 by a negative sign, and synthesizes the fourth amplified modulation signal MA4 multiplied by a negative sign and the third amplified modulation signal MA3, and then outputs the final output signal F0.

Meanwhile, for outputting the final output signal F0 amplified to the same voltage value, the first power supply voltage P1 and the second power supply voltage P2, supplied to the audio signal amplifying device 100 according to the exemplary embodiment, are reduced to half the value of those signals of the conventional audio signal amplifying device. That is, the conventional audio signal amplifying device outputs the final output signal F0, which is amplified to the first power supply voltage P1 or the second power supply voltage P2, when the conventional audio signal amplifying device is supplied with the first power supply voltage P1 and the second power supply voltage P2. However, the audio signal amplifying device 100 according to the exemplary embodiment is capable of outputting the final output signal F0, which is amplified to double of the first power supply voltage P1 or double of the second power supply voltage P2, when the audio signal amplifying device 100 is supplied with the first power supply voltage P1 and the second power supply voltage P2.

Figure 2:
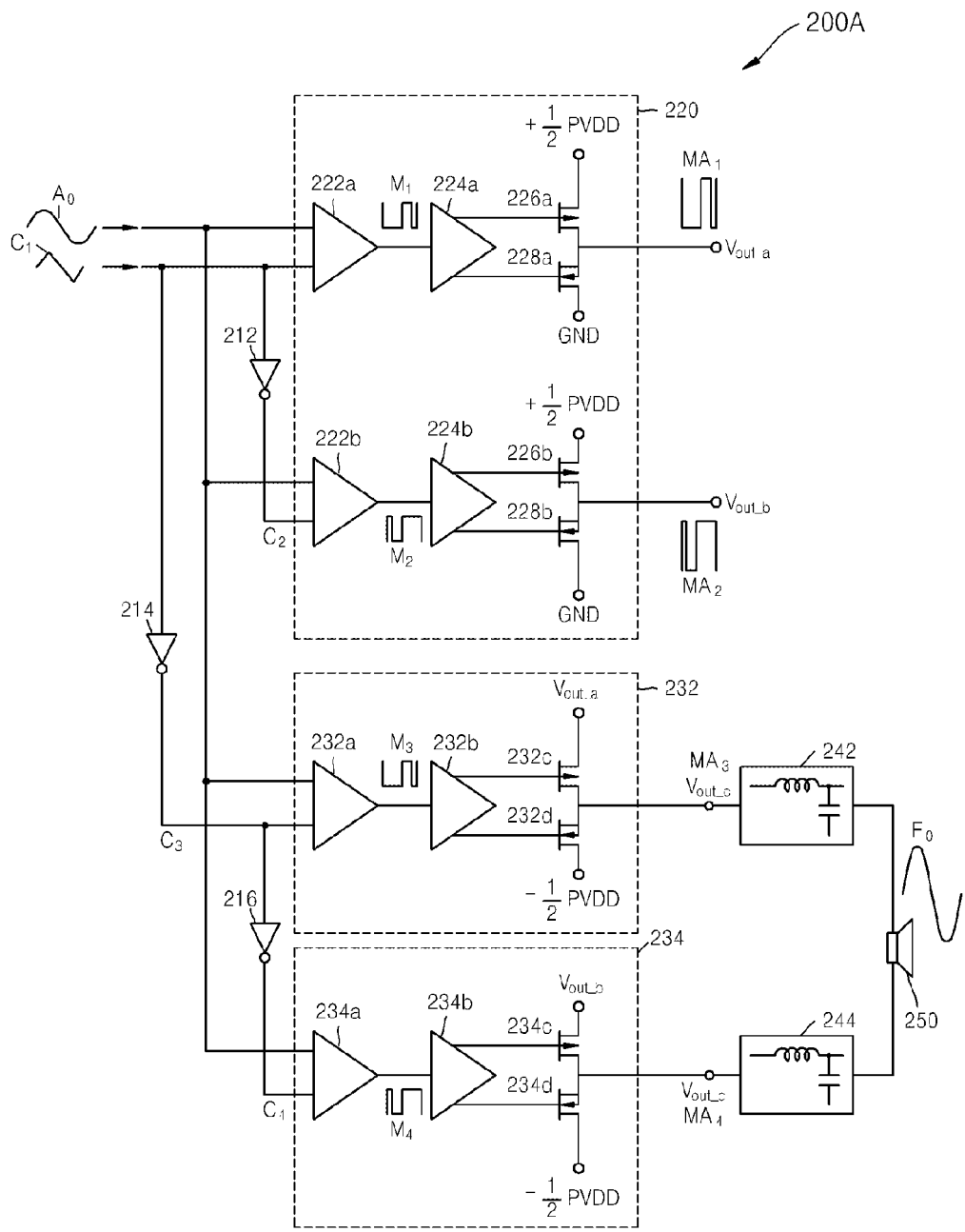
FIG. 2 is a diagram illustrating an audio signal amplifying device according to another exemplary embodiment.

FIG. 2 is a diagram illustrating an audio signal amplifying device according to another exemplary embodiment.

Referring to FIG. 2, the audio signal amplifying device 200A according to this exemplary embodiment includes first to third phase shifters 212, 214 and 216; an amplified modulation signal generation unit 220; first and second output units 232 and 234; first and second demodulation filters 242 and 244; and a final output unit 250. In the exemplary embodiment of FIG. 2, corresponding units of the receiving unit 110 and the carrier wave generation unit 120 of FIG. 1 are omitted. However, the audio signal amplifying device 200A according to the exemplary embodiment of FIG. 2 may further include the corresponding units of the receiving unit 110 and the carrier wave generation unit 120 of FIG. 1.

The first phase shifter 212 generates a second carrier wave C2 by shifting a phase of a first carrier wave C1 as much as 180 degrees when the first phase shifter 212 receives the first carrier wave C1.

The second phase shifter 214 generates a third carrier wave C3 by shifting the phase of the first carrier wave C1 as much as 90 degrees when the second phase shifter 214 receives the first carrier wave C1.

The third phase shifter 216 generates a fourth carrier wave C4 by shifting the phase of the third carrier wave C3 as much as 180 degrees when the third phase shifter 216 receives the third carrier wave C3.

In another exemplary embodiment, a single unit including all of the first to the third phase shifters 212 to 216 may generate the first carrier wave C1, and may generate the second to the fourth carrier waves C2 to C4 using the first to the third phase shifters 212 to 216. Meanwhile, the phases of the first to the fourth carrier waves C1 to C4 are not limited to the above-described example.

The amplified modulation signal generation unit 220 generates a first amplified modulation signal MA1 and a second amplified modulation signal MA2 by amplifying a first modulation signal M1 and a second modulation signal M2, respectively, based on a value of a first power supply voltage +½ PVDD. Herein, the first and the second modulation signals M1 and M2 are respective results of comparing the first and the second carrier waves C1 and C2 with an audio signal A0.

In detail, a first comparator 222a generates the first modulation signal M1 by comparing the first carrier wave C1 with the audio signal A0. A first output buffer 224a outputs the first modulation signal M1 to a first P-type Metal Oxide Semiconductor (PMOS) transistor 226a and a first N-type Metal Oxide Semiconductor (NMOS) transistor 228a.

Accordingly, the first PMOS transistor 226a is turned on when the first modulation signal M1 has a low level state, and thus the first PMOS transistor 226a outputs the first power supply voltage +½ PVDD. The first NMOS transistor 228a is turned on when the first modulation signal M1 has a high level state, and thus the first NMOS transistor 228a outputs a ground voltage GND. In this manner, the first PMOS transistor 226a and the first NMOS transistor 228a output the first amplified modulation signal MA1 through a first middle output terminal Vout_a. This first amplified modulation signal MA1 is supplied to the first output unit 232.

A second comparator 222b generates the second modulation signal M2 by comparing the second carrier wave C2 with the audio signal A0. A second output buffer 224b outputs the second modulation signal M2 to a second PMOS transistor 226b and a second NMOS transistor 228b.

Accordingly, the second PMOS transistor 226b is turned on when the second modulation signal M2 has a low level state, and thus the second PMOS transistor 226b outputs the first power supply voltage +½ PVDD. The second NMOS transistor 228b is turned on when the second modulation signal M2 has a high level state, and thus the second NMOS transistor 228b outputs the ground voltage GND. In this manner, the second PMOS transistor 226b and the second NMOS transistor 228b output the second amplified modulation signal MA2 through a second middle output terminal Vout_b. This second amplified modulation signal MA2 is supplied to the second output unit 234.

The first output unit 232 outputs the first amplified modulation signal MA1 or a second power supply voltage P2, as a third amplified modulation signal MA3, according to a logic state of a third modulation signal M3. Herein, the third modulation signal M3 is a result of comparing the third carrier wave C3 with the audio signal A0.

In detail, a third comparator 232a generates the third modulation signal M3 by comparing the third carrier wave C3 with the audio signal A0. A third output buffer 232b outputs the third modulation signal M3 to a third PMOS transistor 232c and a third NMOS transistor 232d.

Accordingly, the third PMOS transistor 232c is turned on when the third modulation signal M3 has a low level state, and thus the third PMOS transistor 232c outputs the first amplified modulation signal MA1 input to the first output unit 232 through the first middle output terminal Vout_a of the amplified modulation signal generation unit 220. The third NMOS transistor 232d is turned on when the third modulation signal M3 has a high level state, and thus the third NMOS transistor 232d outputs the second power supply voltage, i.e., −½ PVDD. In this manner, the third PMOS transistor 232c and the third NMOS transistor 232d output the third amplified modulation signal MA3 through a third middle output terminal Vout_c.

As a result, the third amplified modulation signal MA3 output by the first output unit 232 has a voltage value of 0V, +½ PVDD, or −½ PVDD, according to the logic state of the third modulation signal M3.

The second output unit 234 outputs the second amplified modulation signal MA2 or the second power supply voltage P2, as a fourth amplified modulation signal MA4, according to a logic state of a fourth modulation signal M4. Herein, the fourth modulation signal M4 is a result of comparing the fourth carrier wave C4 with the audio signal A0.

In detail, a fourth comparator 234a generates the fourth modulation signal M4 by comparing the fourth carrier wave C4 with the audio signal A0. A fourth output buffer 234b outputs the fourth modulation signal M4 to a fourth PMOS transistor 234c and a fourth NMOS transistor 234d.

Accordingly, the fourth PMOS transistor 234c is turned on when the fourth modulation signal M4 has a low level state, and thus the fourth PMOS transistor 234c outputs the second amplified modulation signal MA2 input to the second output unit 234 through the second middle output terminal Vout_b of the amplified modulation signal generation unit 220. The fourth NMOS transistor 234d is turned on when the fourth modulation signal M4 has a high level state, and thus the fourth NMOS transistor 234d outputs the second power supply voltage −½ PVDD. In this manner, the fourth PMOS transistor 234c and the fourth NMOS transistor 234d output the fourth amplified modulation signal MA4 through a fourth middle output terminal Vout_d.

As a result, the fourth amplified modulation signal MA4 output by the second output unit 234 has a voltage value of 0V, +½ PVDD, or −½ PVDD, according to the logic state of the fourth modulation signal M4.

The first demodulation filter 242 performs a demodulation operation for eliminating a carrier wave element from the third amplified modulation signal MA3.

The second demodulation filter 244 performs the demodulation operation for eliminating a carrier wave element from the fourth amplified modulation signal MA4.

At this time, the first and the second demodulation filters 242 and 244 may include an inductor and a capacitor. As the voltage and current of the third and the fourth amplified modulation signals MA3 and MA4 respectively inputted to the first and the second demodulation filters 242 and 244 become smaller, the size of the inductor of the first and the second demodulation filters 242 and 244 becomes smaller.

In the audio signal amplifying device 200A according to the exemplary embodiment, the values of the voltage and current of the third and the fourth amplified modulation signals MA3 and MA4 input to the first and the second demodulation filters 242 and 244 are smaller than those of signals input to demodulation filters of the conventional audio signal amplifying device with the conventional class D modulation method. Therefore, in comparison with the conventional technology, the sizes of the first and the second demodulation filters 242 and 244 may be decreased. Also, if the values of the voltage and current of the third and the fourth amplified modulation signals MA3 and MA4 input to the first and the second demodulation filters 242 and 244 become smaller, the power consumption of the audio signal amplifying device according to the exemplary embodiment is reduced in comparison with the conventional technology.

The difference between the signals input to the demodulation filters of the conventional audio signal amplifying device with the class D modulation method and the third and the fourth amplified modulation signals input to the first and the second demodulation filters of the audio signal amplifying device 200A according to the exemplary embodiment is described later referring to FIGS. 4A and 4B.

The final output unit 250 outputs a final output signal F0 by synthesizing the third and the fourth amplified modulation signals MA3 and MA4, to which the demodulation operation has been performed by the first and the second demodulation filters 242 and 244.

As illustrated in FIG. 2, since the final output signal F0 is outputted by amplifying the audio signal A0 inputted to the audio signal amplifying device, the final output signal F0 has the same sinusoidal form as the audio signal A0.

Meanwhile, as described above, the final output unit 250 may receive the third and the fourth amplified modulation signals MA3 and MA4 through a positive (+) input unit and a negative (−) input unit of the final output unit 250, respectively.

Figure 3:
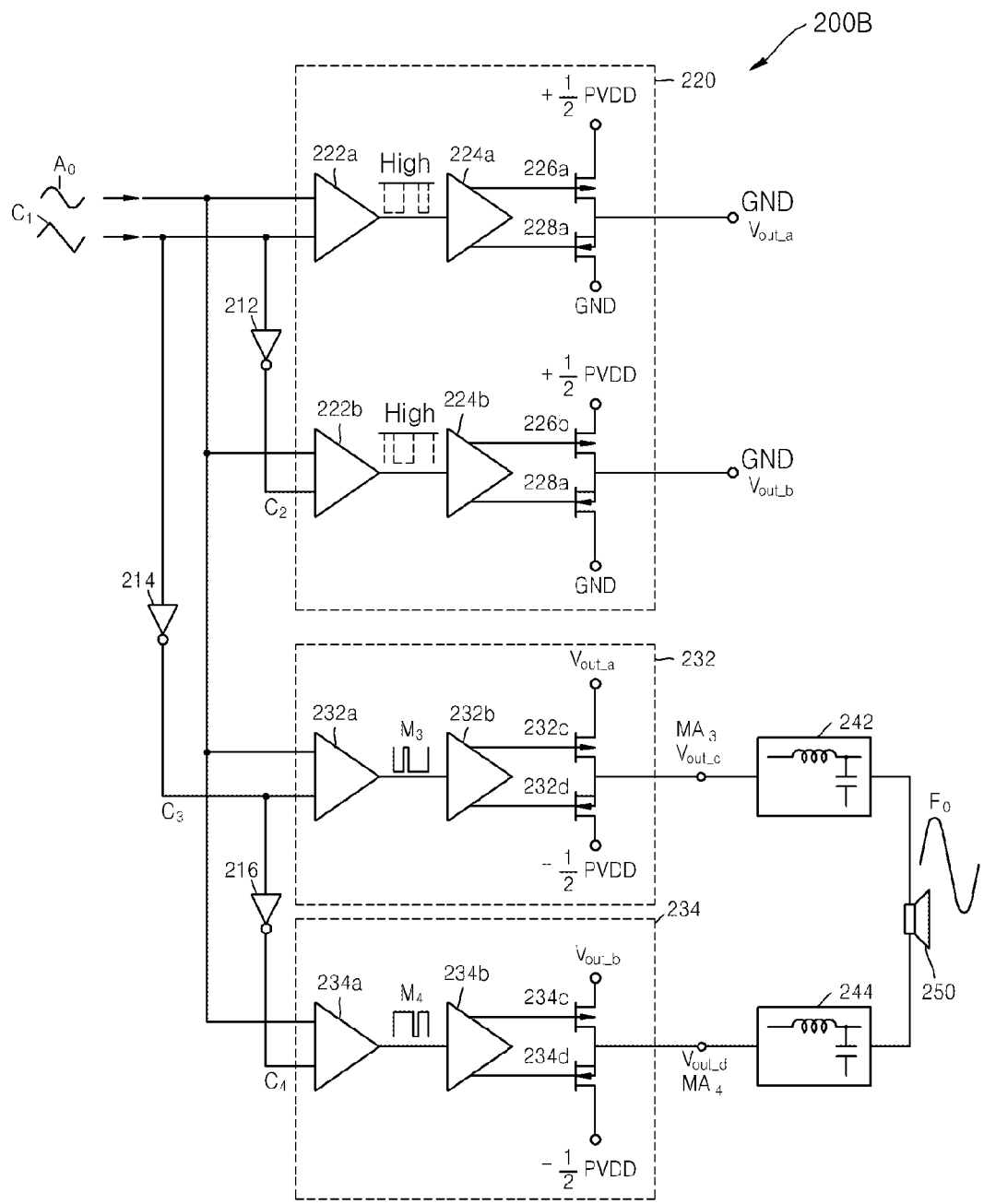
FIG. 3 is a diagram illustrating an audio signal amplifying device according to another exemplary embodiment.

FIG. 3 is a diagram illustrating an audio signal amplifying device according to another exemplary embodiment.

The audio signal amplifying device 200B of FIG. 3, like that of the audio signal amplifying device 200A FIG. 2, includes first to third phase shifters 212, 214 and 216; an amplified modulation signal generation unit 220; first and second output units 232 and 234; first and second demodulation filters 242 and 244; and a final output unit 250.

However, in the audio signal amplifying device 200B of FIG. 3, the maximum voltage value of the audio signal A0 is much smaller than that of the audio signal amplifying device 200A of FIG. 2. Accordingly, the amplified modulation signal generation unit 220 outputs the ground voltage GND through a first middle output terminal Vout_a and a second middle output terminal Vout_b.

An operation of the amplified modulation signal generation unit 220 is described in detail as follows.

If the maximum voltage value of the input audio signal A0 is equal to or lower than a critical value, a first comparator 222a outputs a signal of a high level. A first output buffer 224a outputs the high level signal to a first PMOS transistor 226a and a first NMOS transistor 228a.

Accordingly, the first PMOS transistor 226a is turned off and the first NMOS transistor 228a is turned on so that the first PMOS transistor 226a and the first NMOS transistor 228a output the ground voltage GND. Thus, the ground voltage GND is outputted through the first middle output terminal Vout_a.

Also, if the maximum voltage value of the inputted audio signal A0 is equal to or lower than the critical value, a second comparator 222b outputs a signal of a high level. A second output buffer 224b outputs the high level signal to a second PMOS transistor 226b and a second NMOS transistor 228b.

Accordingly, the second PMOS transistor 226b is turned off and the second NMOS transistor 228b is turned on so that the second PMOS transistor 226b and the second NMOS transistor 228b output the ground voltage GND. Thus, the ground voltage GND is outputted through the second middle output terminal Vout_b.

The first output unit 232 outputs the ground voltage GND or the second power supply voltage P2, as a third amplified modulation signal MA3, according to a logic state of the third modulation signal M3. Herein, the third modulation signal M3 is a result of comparing the third carrier wave C3 with the audio signal A0.

Accordingly, the third amplified modulation signal MA3 output by the first output unit 232 has a voltage value of 0V or −½ PVDD, according to the logic state of the third modulation signal M3.

The second output unit 234 outputs the ground voltage GND or the second power supply voltage P2, as a fourth amplified modulation signal MA4, according to a logic state of the fourth modulation signal M4. Herein, the fourth modulation signal M4 is a result of comparing the fourth carrier wave C4 with the audio signal A0.

Accordingly, the fourth amplified modulation signal MA4 output by the second output unit 234 has a voltage value of 0V or −½ PVDD, according to the logic state of the fourth modulation signal M4.

The final output unit 250 outputs a final output signal F0 by synthesizing the third and the fourth amplified modulation signals MA3 and MA4, to which the demodulation operation has been performed by the first and the second demodulation filters 242 and 244.

In this manner, according to the exemplary embodiment of FIG. 3, in the case where the voltage value of the audio signal A0 input to the audio signal amplifying device 200B is equal to or smaller than the critical value, the final output signal F0 outputted from the final output unit 250 does not greatly switch from −PVDD to +PVDD, but switches in a range from −½ PVDD to +½ PVDD. Therefore, in the case where the voltage value of the input audio signal A0 is small, the switching voltage height for the audio signal A0 is lowered. As a result, the power consumption of the audio signal amplifying device is reduced.

Except for the above explanations, the units illustrated in FIG. 3 perform the same operations as the units illustrated in FIG. 2. Therefore, detailed explanations are omitted.

Figure 4A:
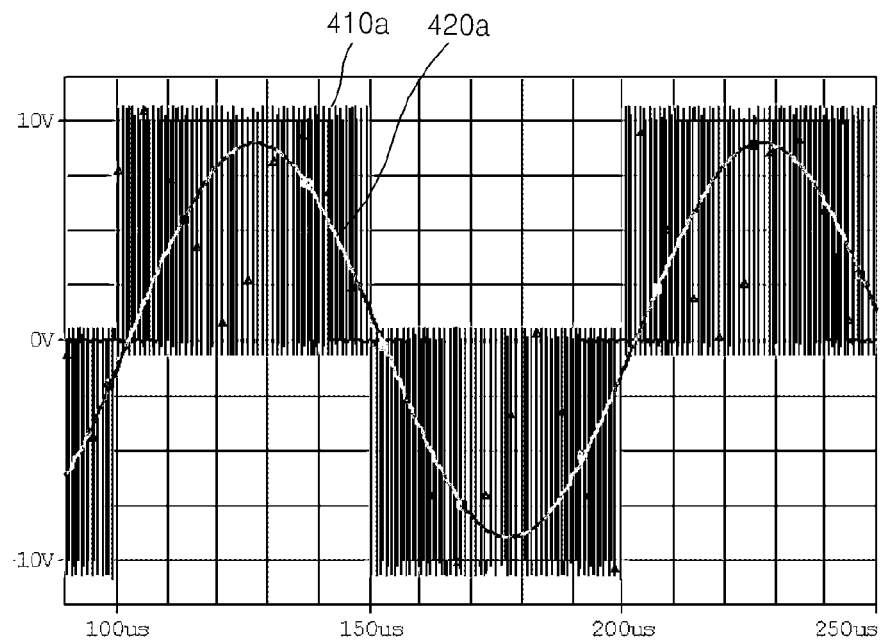
FIG. 4A is a diagram illustrating the voltage values of the signals inputted to the demodulation filters of the conventional audio signal amplifying device.
Figure 4B:
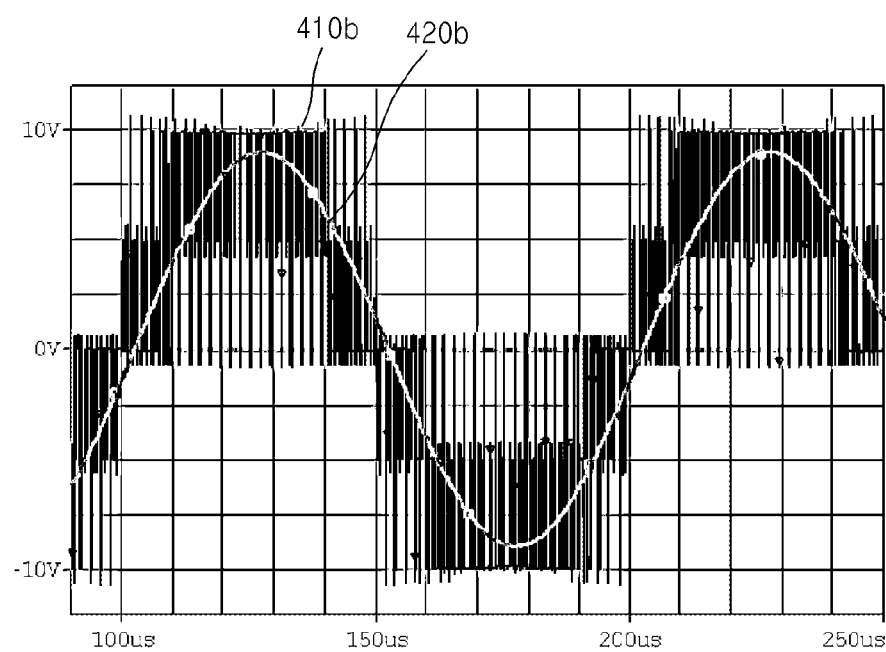
FIG. 4B is a diagram illustrating the voltage values of the signals inputted to the demodulation filters of the audio signal amplifying device according to an exemplary embodiment.

Referring to FIGS. 4A and 4B, the difference between the voltage values of the signals input to the demodulation filters of the conventional audio signal amplifying device and the third and the fourth amplified modulation signals MA3 and MA4 input to the demodulations filters of the audio signal amplifying device according to the exemplary embodiment is described as follows.

FIG. 4A is a diagram for explaining the voltage values of the signals inputted to the demodulation filters of the conventional audio signal amplifying device.

In FIG. 4A, a switching voltage value of a first synthesized signal 410a is illustrated at a time domain. Herein, the first synthesized signal 410a is generated by synthesizing two signals respectively input to two demodulation filters of the conventional audio signal amplifying device. Referring to FIG. 4A, the switching voltage of the first synthesized signal 410a ranges from −10V to 0V until 100 ms, from 0V to +10V at 100 ms to 150 ms, from −10V to 0V at 150 ms to 200 ms, and from 0V to +10V at 200 ms to 250 ms.

In FIG. 4A, a first sinusoidal signal 420a overlapped by the first synthesized signal 410a, illustrated with a solid line, represents a signal that is generated when the carrier wave element is eliminated from the first synthesized signal 410a. That is, the first sinusoidal signal 420a is a final output signal obtained by eliminating the carrier wave element from the first synthesized signal 410a.

FIG. 4B is a diagram for explaining the voltage values of the signals inputted to the demodulation filters of the audio signal amplifying device according to the exemplary embodiment.

In FIG. 4B, a switching voltage value of a second synthesized signal 410b is illustrated. Herein, the second synthesized signal 410b is generated by synthesizing the third and the fourth amplified modulation signals MA3 and MA4 respectively input to two demodulation filters of the audio signal amplifying device according to the exemplary embodiment. Referring to FIG. 4B, the switching value of the second synthesized signal 410b is mostly ranged from about −10V to about −5V until 80 ms, from about −5V to about 0V at 90 ms to 100 ms, from about 0V to about +5V at 100 ms to 110 ms, from about +5V to about +10V at 110 ms to 140 ms, from about 0V to about +5V at 140 ms to 150 ms, from about 0V to about −5V at 150 ms to 160 ms, from about −5V to about −10V at 160 ms to 190 ms, from about −5V to about 0V at 190 ms to 200 ms, from about 0V to about +5V at 200 ms to 210 ms, from about +5V to about +10V at 210 ms to 240 ms, and from about 0V to about +5V at 240 ms to 250 ms.

In FIG. 4B, a second sinusoidal signal 420b overlapped by the second synthesized signal 410b, illustrated with a solid line, represents a signal which is generated when the carrier wave element is eliminated from the second synthesized signal 410b. That is, the second sinusoidal signal 420b is a final output signal obtained by eliminating the carrier wave element from the second synthesized signal 410b.

Comparing the final output signals of FIGS. 4A and 4B, both of them are sinusoidal signals have voltage levels that range from −10V to 10V.

However, while the first synthesized signal 410a of FIG. 4A has a voltage level of −10V or +10V during the entire time period, the second synthesized signal 410b of FIG. 4B not only has a time period of a voltage level of −10V or +10V but also has a time period of a voltage level of −5V or +5V. Therefore, although the maximum voltage value of the second synthesized signal 410b of FIG. 4B is the same as that of the first synthesized signal 410a, the average voltage value and average current value of the second synthesized signal 410b are smaller than those of the first synthesized signal 410a of FIG. 4A.

Accordingly, the size of the demodulation filters of the audio signal amplifying device according to the exemplary embodiment invention become smaller in comparison to the demodulation filters of the conventional audio signal amplifying device.

FIG. 5 is a flowchart illustrating a method of amplifying the audio signal according to an exemplary embodiment.

In operation 510, the audio signal A0 is received.

In operation 520, the first to the fourth carrier waves C1 to C4, whose phases are different from one another, are generated.

In operation 530, the first amplified modulation signal MA1 and the second amplified modulation signal MA2 are generated by amplifying the first modulation signal M1 and the second modulation signal M2, respectively, based on a voltage value of the first power supply voltage P1. Herein, the first and the second modulation signals M1 and M2 are respective results of comparing the first and the second carrier waves C1 and C2 with the audio signal A0.

However, according to another exemplary embodiment, in operation 530, a control process may be further performed. That is, during the control process, it is checked whether the maximum voltage value of the audio signal A0 is equal to or lower than the critical value. Then, in the case where the maximum voltage value of the audio signal A0 is equal to or lower than the critical value, two voltages approximated to 0V are output instead of the first and the second amplified modulation signals MA1 and MA2.

In operation 540, the first amplified modulation signal MA1 or the second power supply voltage P2 is output, as the third amplified modulation signal MA3, according to a logic state of the third modulation signal M3. Herein, the third modulation signal M3 is a result of comparing the third carrier wave C3 with the audio signal A0.

In the case where the two voltages approximated to 0V are outputted instead of the first and the second amplified modulation signals MA1 and MA2 in operation 530, the third amplified modulation signal MA3 has a voltage value approximated to 0V or a voltage value of the second power supply voltage P2 in operation 540.

In operation 550, the second amplified modulation signal MA2 or the second power supply voltage P2 is output, as the fourth amplified modulation signal MA4, according to a logic state of the fourth modulation signal M4. Herein, the fourth modulation signal M4 is a result of comparing the fourth carrier wave C4 with the audio signal A0.

In the case where the two voltages approximated to 0V are outputted instead of the first and the second amplified modulation signals MA1 and MA2 in operation 530, the fourth amplified modulation signal MA4 has a voltage value approximated to 0V or a voltage value of the second power supply voltage P2 in operation 550.

In operation 560, the third and the fourth amplified modulation signals MA3 and MA4 are synthesized, and then the synthesized signal is outputted.

Meanwhile, the above-described exemplary embodiments may be written as a program to be performed by a computer. By using a computer-readable recording medium, the embodiments may be realized at a general-purpose digital computer including a processor which operates the program.

The computer-readable recording medium includes a magnetic storage medium (e.g., ROM, floppy disk, hard disk and the like) and an optical reading medium (e.g., CD-ROM, DVD and the like).

While the present disclosure has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An audio signal amplifying device, comprising:
   a receiving unit that receives an audio signal;
   a carrier wave generation unit that generates first, second, third, and fourth carrier waves, the first, second, third, and fourth carrier waves having phases that are different from one another;
   an amplified modulation signal generation unit that compares voltage values of the first carrier wave and the second carrier wave to the audio signal, respectively, generates a first modulation signal and a second modulation signal, respectively, based on results of the voltage value comparisons, amplifies the first modulation signal and the second modulation signal, respectively, based on a value of a first power supply voltage, and generates a first amplified modulation signal and a second amplified modulation signal from the amplified first modulation signal and the amplified second modulation signal, respectively;
   a first output unit that outputs a first output, voltage values of the first output comprising one of the first amplified modulation signal or a second power supply voltage, according to a logic state of a third modulation signal, the third modulation signal generated from a result of comparing the third carrier wave to the audio signal;

a second output unit that outputs a second output, voltage values of the second output comprising one of the second amplified modulation signal or the second power supply voltage, according to a logic state of a fourth modulation signal, the fourth modulation signal generated from a result of comparing the fourth carrier wave to the audio signal; and a final output unit that synthesizes the first output and the second output, and outputs the synthesized signal in which voltage values can be double of the first power supply voltage or double of the second power supply voltage.

2. The audio signal amplifying device of claim 1, wherein each of the first and the second amplified modulation signals has a first voltage period having a first logic state and a second voltage period having a second logic state, and wherein a portion of the first voltage period of the first amplified modulation signal is overlapped by a portion of the first voltage period of the second amplified modulation signal.

3. The audio signal amplifying device of claim 1, wherein the carrier wave generation unit generates the first carrier wave, and generates the second, the third, and the fourth carrier waves by shifting a phase of the first carrier wave.

4. The audio signal amplifying device of claim 3, wherein a phase difference between the first and the second carrier waves is 180 degrees, and a phase difference between the third and the fourth carrier waves is 180 degrees.

5. The audio signal amplifying device of claim 1, wherein the first and second modulation signals are Pulse Width Modulation (PWM) signals.

6. The audio signal amplifying device of claim 1, wherein the first and the second power supply voltage have absolute voltage values that are equal to each other.

7. The audio signal amplifying device of claim 1, further comprising a demodulation filter that demodulates the first output and the second output, wherein the final output unit synthesizes the demodulated first output and the demodulated second output, and outputs the synthesized signal.

8. The audio signal amplifying device of claim 1, wherein the final output unit inverts a sign of the second, and synthesizes the inverted second output and the first output, and outputs the synthesized signal.

9. A method of amplifying an audio signal, comprising:
receiving an audio signal;
generating first, second, third, and fourth carrier waves, the first, second, third, and fourth carrier waves having phases that are different from one another;
comparing voltage values of the first carrier wave and the second carrier wave to the audio signal, respectively;
generating a first modulation signal and a second modulation signal, respectively, based on results of the comparing;
amplifying the first modulation signal and the second modulation signal, respectively, based on a value of a first power supply voltage;
generating a first amplified modulation signal and a second amplified modulation signal from the amplified first modulation signal and the amplified second modulation signal, respectively;
outputting a first output, voltage values of the first output comprising one of the first amplified modulation signal or a second power supply voltage, according to a logic state of a third modulation signal, the third modulation signal generated from a result of comparing voltage values of the third carrier wave to the audio signal;
outputting a second output, voltage values of the second output comprising one of the second amplified modulation signal or the second power supply voltage, according to a logic state of a fourth modulation signal, the fourth modulation signal generated from a result of comparing the fourth carrier wave to the audio signal;
synthesizing the first output value and the second output value to generate a synthesized signal; and
outputting the synthesized signal in which voltage values can be double of the first power supply voltage or double of the second power supply voltage.

10. The method of claim 9, wherein each of the first and the second amplified modulation signals has a first voltage period having a first logic state and a second voltage period having a second logic state, and wherein a portion of the first voltage period of the first amplified modulation signal is overlapped by a portion of the first voltage period of the second amplified modulation signal.

11. The method of claim 9, wherein the generating the first, the second, the third, and the fourth carrier waves comprises:
generating the first carrier wave; and
generating the second, the third, and the fourth carrier waves by shifting a phase of the first carrier wave.

12. The method of claim 11, wherein a phase difference between the first and the second carrier waves is 180 degrees, and a phase difference between the third and the fourth carrier waves is 180 degrees.

13. The method of claim 9, wherein the first and second modulation signals are Pulse Width Modulation (PWM) signals.

14. The method of claim 9, wherein the first and the second power supply voltage have absolute voltage values that are equal to each other.

15. The method of claim 9, further comprising demodulating the first output and the second output, and
wherein the synthesizing comprises synthesizing the demodulated first output and the demodulated second output.

16. The method of claim 9, wherein the synthesizing further comprises:
inverting a sign of the second output; and
synthesizing the inverted second output and the first output.

17. A non-transitory computer-readable recording medium storing a program for performing the method of claim 9.

18. An audio signal amplifying device, comprising:
a receiving unit that receives an audio signal;
a carrier wave generation unit that generates first, second, third, and fourth carrier waves, the first, second, third, and fourth carrier waves having phases that are different from one another;
a voltage control unit that determines whether a maximum voltage of the audio signal is less than or equal to a critical value;
an amplified modulation signal generation unit that, in response to the voltage control unit determining that the maximum voltage of the audio signal is less than or equal to the critical value, outputs a first output voltage approximated to 0V and a second output voltage approximated to 0V, and
that, in response to the voltage control unit determining that the maximum voltage of the audio signal is not less than or equal to the critical value, compares voltage values of the first carrier wave and the second carrier wave to the audio signal, respectively, generates a first modulation signal and a second modulation signal, respectively, based on results of the comparisons, amplifies the first modulation signal and the second modulation signal, respectively, based on a value of a first power supply voltage, and generates a first amplified modulation signal and a second amplified modulation signal from the amplified first modulation signal and the amplified second modulation signal, respectively;

a first output unit that outputs a first output, voltage values of the first output comprising one of the first amplified modulation signal or a second power supply voltage if the voltage control unit determines that the maximum voltage of the audio signal is less than or equal to the critical value, the first output comprising one of the first output voltage or the second power supply voltage if the voltage control unit determines that the maximum voltage of the audio signal is not less than or equal to the critical value, according to a logic state of a third modulation signal, the third modulation signal generated from a result of comparing the third carrier wave to the audio signal;

a second output unit that outputs a second output, voltage values of the second output comprising one of the second amplified modulation signal or the second power supply voltage if the voltage control unit determining that the maximum voltage of the audio signal is less than or equal to the critical value, the second output comprising the second output voltage or the second power supply voltage if the voltage control unit determines that the maximum voltage of the audio signal is not less than or equal to the critical value, according to a logic state of a fourth modulation signal, the fourth modulation signal generated from a result of comparing the fourth carrier wave to the audio signal; and a final output unit that synthesizes the first output and the second output, and outputs the synthesized signal in which voltage values can be double of the first power supply voltage or double of the second power supply voltage.

19. A method of amplifying an audio signal, comprising:
receiving an audio signal;
generating first, second, third, and fourth carrier waves, the first, second, third, and fourth carrier waves having phases that are different from one another;
determining whether a maximum voltage of the audio signal is less than or equal to a critical value;
in response determining that the maximum voltage of the audio signal is less than or equal to the critical value:
outputting a first output voltage approximated to 0V and a second output voltage approximated to 0V;
outputting a first output, the first output comprising one of the first output voltage or the second power supply voltage, according to a logic state of a third modulation signal, the third modulation signal generated from a result of comparing the third carrier wave to the audio signal; and
outputting a second output, the second output comprising the second output voltage or the second power supply voltage, according to a logic state of a fourth modulation signal, the fourth modulation signal generated from a result of comparing the fourth carrier wave to the audio signal;

in response to determining that the maximum voltage of the audio signal is not less than or equal to the critical value:
comparing voltage values of the first carrier wave and the second carrier wave to the audio signal, respectively;
generating a first modulation signal and a second modulation signal, respectively, based on results of the voltage values comparing;
amplifying the first modulation signal and the second modulation signal, respectively, based on a value of a first power supply voltage; and
generating a first amplified modulation signal and a second amplified modulation signal from the amplified first modulation signal and the amplified second modulation signal, respectively;
outputting a first output, voltage values of the first output comprising one of the first amplified modulation signal or a second power supply voltage, according to a logic state of a third modulation signal, the third modulation signal generated from a result of comparing the third carrier wave to the audio signal; and
outputting a second output, voltage values of the second output comprising one of the second amplified modulation signal or the second power supply voltage, according to a logic state of a fourth modulation signal, the fourth modulation signal generated from a result of comparing the fourth carrier wave to the audio signal;
synthesizing the first output value and the second output value, generated based on a result of the determining, to generate a synthesized signal; and
outputting the synthesized signal in which voltage values can be double of the first power supply voltage or double of the second power supply voltage.

20. An audio signal amplifying device comprising:
a receiver that receives an audio signal;
a wave generation unit that generates a plurality of carrier waves, the plurality of carrier waves having phases that are different from each other;
a signal generation unit that generates a plurality of modulation signals based on voltage value comparisons of voltage values of first carrier waves among the plurality of carrier waves generated by the wave generation unit to the audio signal;
a plurality of output units that each output one of a modulation signal among the plurality of modulation signals and a power supply voltage based on a result of a voltage values comparison of second carrier waves among the plurality of carrier waves to the audio signal; and
a synthesizer that synthesizes the outputs of the plurality of output units as an output signal.

* * * * *